US008507325B2

(12) United States Patent
Farooq et al.

(10) Patent No.: US 8,507,325 B2
(45) Date of Patent: Aug. 13, 2013

(54) CO-AXIAL RESTRAINT FOR CONNECTORS WITHIN FLIP-CHIP PACKAGES

(75) Inventors: Mukta G. Farooq, Hopewell Junction, NY (US); John A. Fitzsimmons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 12/695,312

(22) Filed: Jan. 28, 2010

(65) Prior Publication Data
US 2011/0180920 A1 Jul. 28, 2011

(51) Int. Cl.
*H01L 21/44* (2006.01)

(52) U.S. Cl.
USPC .................................. 438/121; 257/E21.506

(58) Field of Classification Search
USPC .. 438/612–613, 108, 121, 616; 257/E21.506
See application file for complete search history.

(56) References Cited

U.S. PATENT DOCUMENTS

| 5,660,624 | A | 8/1997 | Dry |
| 6,121,689 | A | 9/2000 | Capote et al. |
| 6,659,329 | B1 | 12/2003 | Hall |
| 6,917,106 | B2 | 7/2005 | Datta |
| 6,995,474 | B1 * | 2/2006 | Ho et al. ........................ 257/781 |
| 7,108,914 | B2 | 9/2006 | Skipor et al. |
| 7,332,821 | B2 * | 2/2008 | Bernier et al. ................. 257/780 |
| 7,566,649 | B2 * | 7/2009 | Bernier et al. ................. 438/612 |
| 8,030,200 | B2 * | 10/2011 | Eom et al. ..................... 438/612 |
| 2005/0127143 | A1 | 6/2005 | Kubokawa et al. |
| 2005/0133572 | A1 | 6/2005 | Brese et al. |
| 2006/0027632 | A1 | 2/2006 | Akram |
| 2006/0040567 | A1 | 2/2006 | Bernier et al. |
| 2008/0009101 | A1 | 1/2008 | Bernier et al. |
| 2008/0079134 | A1 | 4/2008 | Lin et al. |
| 2009/0108442 | A1 | 4/2009 | Fitzsimmons et al. |

* cited by examiner

*Primary Examiner* — Hoa B Trinh
(74) *Attorney, Agent, or Firm* — Derek S. Jennings

(57) ABSTRACT

An assembly can include a microelectronic element such as, for example, a semiconductor element having circuits and semiconductor devices fabricated therein, and a plurality of electrical connectors, e.g., solder balls attached to contacts of the microelectronic element. The connectors can be surrounded by first, inner regions 200 of compressible dielectric material and second, outer regions of dielectric material. In one embodiment, an underfill can contact a face of the microelectronic element between respective connectors or second regions. The second regions can provide restraining force, such that during volume expansion of the connectors, the first regions can compress against the restraining force of the second regions.

11 Claims, 6 Drawing Sheets

CO-AXIAL RESTRAINT FOR CONNECTORS WITHIN FLIP-CHIP PACKAGES

BACKGROUND OF THE INVENTION

1. Field of the Invention

The present invention relates to methods of interconnecting microelectronic elements or microelectromechanical (MEM) elements, e.g., semiconductor chips, integrated circuits and the like and assemblies including semiconductor chips.

2. Description of the Related Art

Microelectronic elements, e.g., semiconductor wafers or semiconductor chips, inter alia, require packaging before they can be incorporated into larger electronic systems. In most cases, semiconductor chips cannot be connected directly to circuit panels, e.g., printed wiring boards, due to electrical reasons, mechanical reasons, or both. Chips require packaging for electrical reasons when the contacts on the chip are too densely packed and too numerous to connect directly to a circuit panel. Packaging may also be required to minimize inductance and capacitance along signal paths to and from a chip. Chips also require packaging for mechanical reasons, due to differences in the materials from which a chip and a printed wiring board typically are made. Because of the differences in materials, when the chip heats up during operation, a chip carrier or substrate to which the chip is connected typically expands at a faster rate than the chip. The chip carrier expands faster because it has a coefficient of thermal expansion ("CTE") which is higher than that of the chip.

This problem of one element expanding to a different degree than the chip, called "thermal expansion mismatch", needs to be managed so that the semiconductor chip performs reliably over its entire lifetime. This is especially important for some chips such as processor chips which experience temperature rises during operation of 100° C. or more. In a flip-chip package, especially, solder bumps are used to mount a semiconductor chip to a chip carrier or substrate. In order to lessen thermal expansion mismatch, the chip carrier or substrate can be made from a material having a coefficient of thermal expansion at or close to that of the chip. Such chip carriers or substrates, typically made of glass or ceramic materials, can be expensive to make and harder to work with. Other chip carriers which include polymeric dielectric layers, such as polyimide, for example, are less expensive and may be easier to use, but have a CTE higher than that of semiconductor chips. For example, while silicon has a CTE of 3.5 parts per million per degree C. (ppm/° C.), polyimide typically has a CTE of about 12 to 15 ppm/° C. In such case, the package must be designed to cope with the stresses due to thermal expansion mismatch between the chip and chip carrier which are unavoidable due to the difference between the semiconductor material of the chip and that of the polymeric dielectric layer. In addition, the package must be designed to accommodate thermal expansion of the soldered joints themselves.

Sometimes, an underfill is provided as a layer helping to stiffen the interface between the front face of the chip and the chip carrier or substrate. The underfill limits the movement of the chip relative to the chip carrier and typically fills all the space between the front face of the chip and the chip carrier. In addition, the underfill can be disposed to surround each solder bump individually. The underfill, as well as the material of which the chip carrier is constructed, help manage the stresses in the package due to thermal expansion mismatch.

Traditionally, lead and tin are alloyed together to form a solder. Traditionally, some solders have included a high percentage content of lead, as was used in traditional C4 ("controlled collapse chip connect") packaging and interconnect technology pioneered by International Business Machines Corporation. A high lead content solder can have a melting temperature of about 375° C., which is significantly higher than that of tin at 232° C. Because of this, solder joints are formed at relatively high melting temperatures, allowing subsequent processes to be performed at higher temperatures as well. At operating temperatures of the chip, lead can have a comparative advantage over tin in that lead is softer than tin and yields to stresses more than tin. Flip-chip packages which include high lead content solder joints can generally withstand internal stresses within the package due to thermal expansion mismatch.

However, recent industry developments are requiring changes in the ways that microelectronic elements are packaged and externally interconnected. For various reasons, lead-free solders are required in applications where until now lead-containing solders had been used. Lead-free solders usually have much greater amounts of tin. Typical lead-free solders such as SnAg, SnCu, SnAgCu, do not yield to stress as much as lead, such that solder bumps formed of lead-free solder can delaminate from their attachment points more readily than lead. Moreover, because they yield less to stress, lead-free solder bumps tend to transfer stress to the chip or the chip carrier more readily than lead-based solder bumps. This can cause the electrical connection formed by the solder bump to break off completely, causing device failures.

Consequently, a current need exists to provide chip packages which are suitable for use in high thermal stress applications, among others, without requiring lead-containing solders to be used. It would further be desirable to provide packages which can withstand high thermal stress and not fail or cause electrical breakages that can cause device failures.

SUMMARY OF THE INVENTION

In accordance with an embodiment of the invention, a microelectronic assembly is provided which can include a microelectronic element having a face and a plurality of electrically conductive connectors, each having a surface facing away from the face of the microelectronic element. The assembly can have a plurality of compressible dielectric first regions which contact surfaces of the connectors and surrounding the connectors in directions along the face of the microelectronic element. A plurality of dielectric second regions can surround the first regions with at least portions of adjacent ones of the second regions are spaced apart from one another. The first regions can be more compressible than the second regions. In a particular embodiment, the second regions can be substantially rigid. In one embodiment, the connectors can include a solder, tin or a lead-free solder.

In accordance with an embodiment of the invention, the microelectronic element can be a semiconductor chip and the microelectronic assembly can further include a carrier having a contact-bearing face and a plurality of contacts exposed thereat. The face of the carrier can face toward the connectors, and the contacts can be electrically connected with the connectors.

In one embodiment, an underfill is optionally disposed between the faces of the chip and the carrier between adjacent ones of the second regions. The underfill can be less compressible than the second regions.

In a particular embodiment, the plurality of first regions can include a thermoplastic material having a glass transition temperature at or below an operating temperature of the microelectronic element.

In a particular embodiment, the plurality of second regions can include a thermoplastic material which has a glass transition temperature at or below an operating temperature of the microelectronic element.

In one embodiment, the compressibility of at least one of the plurality of first regions or the plurality of second regions can be graded with distance from the connectors.

In accordance with an embodiment of the invention, a method is provided for forming a microelectronic assembly having at least some of the features of the above-described microelectronic assembly.

In accordance with another embodiment of the invention, a method is provided for fabricating a microelectronic assembly. Such method can include: forming a plurality of electrically conductive connectors extending away from a face of a microelectronic element. Each of the connectors may have a surface facing away from the face of the microelectronic element. Compressible dielectric first regions can be formed which contact surfaces of the connectors and surround the connectors. Compressible dielectric second regions can be formed which surround the dielectric first regions. The first regions can be more compressible than the second regions.

DETAILED DESCRIPTION

A current need exists to improve flip-chip packaged microelectronic elements and processes for producing them. Particularly in the context of flip-chip packaged microelectronic elements incorporating a chip carrier which is not thermally matched with the microelectronic element, e.g., a chip carrier consisting primarily of a polymer such as polyimide, a current need exists to produce packages which can better withstand thermal stress. Packages which incorporate lead-free solders can especially benefit in accordance with embodiments of the invention shown and described herein.

As the semiconductor industry migrates to more fragile back end of the line (BEOL) materials and to stiffer bonding metals and solders (such as lead-free solders or alloys), the overall tolerances for making and operating flip-chip packages becomes narrower. The embodiments described herein with respect to FIGS. 1-10 may make it possible to expand tolerance windows for the making and using of flip-chip packages.

Figure 1A:
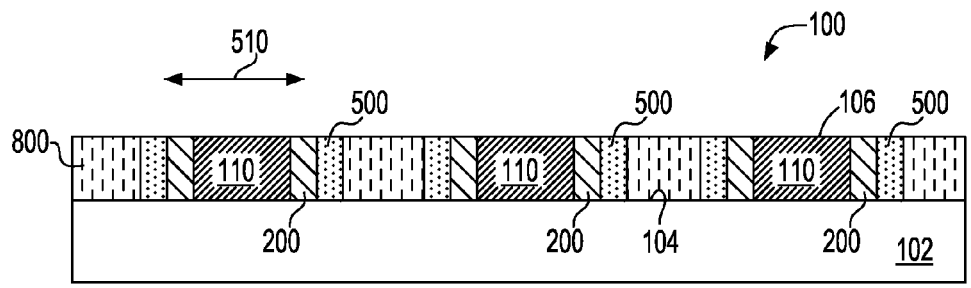
FIG. 1A is a sectional view illustrating a microelectronic assembly in accordance with an embodiment of the invention.
Figure 1B:
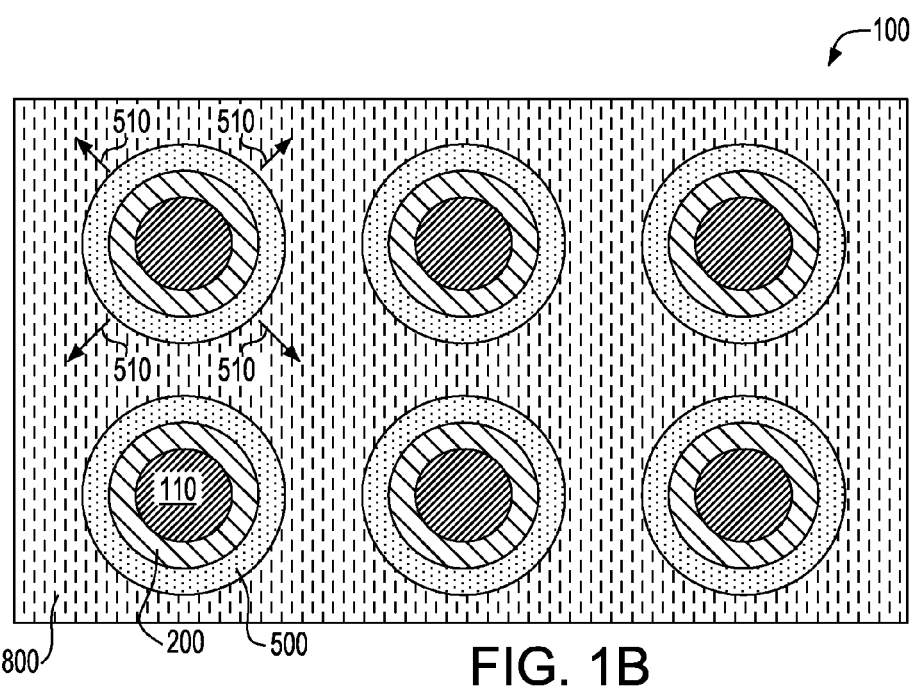
FIG. 1B is a plan view corresponding to the microelectronic assembly shown in FIG. 1A.

FIG. 1A is a sectional view illustration of a microelectronic assembly 100 in accordance with an embodiment of the present invention. The assembly 100 can include a microelectronic element 102, which can be, for example, a semiconductor element having circuits and semiconductor devices fabricated therein. For example, a microelectronic element can be a wafer containing a plurality of semiconductor chips attached together at edges of the chips, a portion of such wafer, a semiconductor chip, or a plurality of semiconductor chips attached at edges of the chips. The microelectronic assembly 100 can include a plurality of electrical connectors 110 attached to contacts (not shown) of the microelectronic element, such as, for example, solder balls or other connectors including solder or tin. The connectors can be surrounded by first, inner regions 200 of compressible dielectric material and second, outer regions 500 of compressible dielectric material. Thus, the structure can include electrical connectors having surrounding co-axial first regions, which in turn can be surrounded by co-axial second regions. As also seen in FIGS. 1A-B, typically, a first region can entirely surround a connector 100 in directions 510 along the face of the microelectronic element, except for the connector surface which is adjacent the face 104 of the microelectronic element 102 and joined thereto, and a connector surface 106 which is remote from the microelectronic element for connection to another element, such as a carrier or package component.

As seen in FIGS. 1A, B and C, an underfill 800 can contact a face 104 of the microelectronic element 102 between respective outer regions. Typically, the underfill is provided as a continuous layer which completely fills the spaces between the outer regions 500 of compressible material. At this stage of processing, the inner regions, the outer regions, the underfill or some combination thereof can be as yet uncured or only partially cured. However, it is possible for at least the inner regions and outer regions to be cured before undergoing further processing.

Figure 1C:
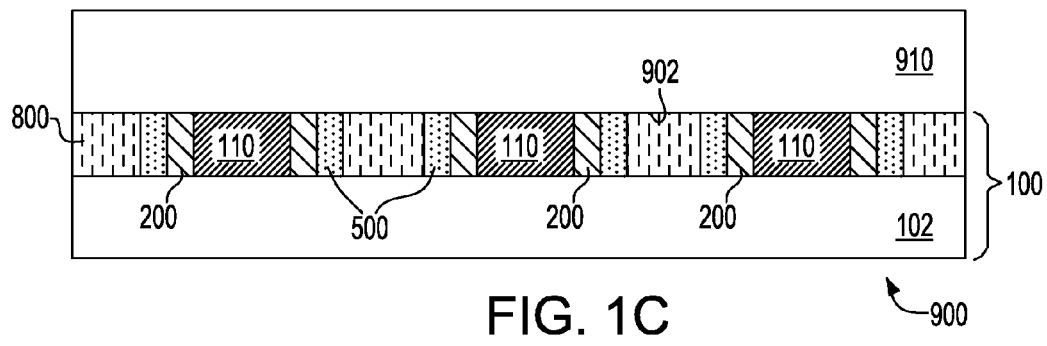
FIG. 1C is a sectional view illustrating a microelectronic package in accordance with an embodiment of the invention.

FIG. 1C is a sectional view illustration of a packaged microelectronic element 900 in accordance with one embodiment of the present invention. In FIG. 1C, a contact-bearing face 902 of a carrier 910, e.g., a packaging layer, package substrate, or other element, is juxtaposed with the connectors and underfill of the assembly 100. Typically, the carrier 910 is juxtaposed at the face 902 thereof with the underfill 800 with the contacts of the carrier (not shown) adjacent to the connectors 110, and thereafter the assembly is heated with the carrier thereon to join the connectors 110 with the contacts of the carrier and curing the underfill after the carrier is joined therewith.

The first layer of compressible material 200 and the second layer of material 500 can be selected from materials having appropriately selected Young's moduli to provide a programmed restraining force in response to stress applied thereto as a result of thermal expansion of connectors 110. The combined inner and outer regions can permit expansion in the size (volume) of the connectors in response to thermal expansion, and can also be programmed to provide a restraining force to limit the expansion in volume as the size of individual connectors expand in normal operation of the microelectronic package, or when the connectors are being joined with the contacts of the carrier, as will be discussed in further detail below. In one embodiment, visco-elastic properties of the first and second regions are selected such that a gradual and programmed stiffness can be achieved to restrain the expansion of the connectors as the connectors expand towards a predetermined volume.

In one embodiment, a programmed stiffness can be achieved using composite co-axial first and second regions 200, 500 by forming the inner regions 200 of a compliant, e.g., pliable elastic material. The first regions can be surrounded by second regions 500 which can include a compressible material different from the first regions. The material of the second regions can be relatively more rigid than that of the first regions. The second regions 500 can be more rigid than the first regions so as to resist elastic deformation. Thus, under volume expansion of the connectors, such as due to thermal expansion, the second regions 500 can provide a restraining force against expansion of the first regions. In packages that include an underfill, when the second regions are less rigid than the underfill, the second regions can also yield to stresses to a greater extent than the underfill.

In a particular embodiment, a graded stiffness can be programmed into the co-axial structure, using two or more co-axial regions 200, 500 of materials having properties selected to achieve this objective. By selecting a suitable co-axial construction of two or more layers, the effective stiffness of the interior layers may be modified by the choice of the mechanical properties of the externally encompassing material structures. This can add increased or decreased stiffness depending on the application. In this way, in each case, the interior layers will be confined by surrounding layer structure such that a defined compressibility relationship is produced, rather than the uncontrolled or random relationships that would occur when these materials are selected without considering the in plane axial forces.

According to one embodiment, the underfill layer 800 can be selected to accommodate the volume expansion of the carrier and interactions at the joints between the package and a further component, e.g., global substrate, printed circuit board, etc. to which the packaged microelectronic element will be electrically connected. The selection of the underfill can be made based on differences in component thermal expansion characteristics which significantly affect stress during high or maximum thermal excursions of the package.

In one embodiment, the inner regions 200 can include or consist essentially of a thermoplastic material which has a glass transition temperature (Tg) which is at or below a normal operating temperature of the microelectronic element. In that case, at temperatures lower than the operating temperature, the material of the inner regions 200 can be in form of a stable matrix resembling a solid, which can be sufficiently stiff to help maintain integrity of the package, especially when the microelectronic element is not operating, is subjected to cold temperatures, or is subjected to thermal cycling stress. When the temperature reaches or exceeds the glass transition temperature, the inner regions can undergo a change from the stable solid-like matrix to a viscous liquid having dramatically reduced stiffness. In one example, the transition from relatively stiff material properties to relatively compliant material properties can be rather steep, i.e., the transition can occur over a fairly small temperature range of 5 to 10° C.

When in the stable matrix, the inner regions can resist deformation due to contraction of the connectors 110, carrier 910 and the chip 102 when the temperature of the microelectronic element decreases, thus helping maintain the integrity of the package. On the other hand, when the temperature rises and reaches the normal operating temperature of the microelectronic element, the inner regions can then yield to stresses which occur due to differential thermal expansion between the connectors 110, the carrier 910 and the chip 102. Moreover, the second regions 500 can also have thermoplastic properties with a glass transition temperature at or near the normal operating temperature of the chip.

The inner regions 200 of the microelectronic assembly 100 (FIGS. 1A-B) can be sufficiently compliant to fully accommodate expansion of the bonding metal of the connectors 110 when heating the connectors to a sufficiently high temperature to melt the bonding metal thereof and join the microelectronic assembly 100 to a carrier. The compliancy of the inner regions 200 allows for volume expansion in lateral directions 510, i.e., laterally outward directions along a surface 104 of the microelectronic element 102. The inner regions can also accommodate differential thermal expansion between assembly components, i.e., connectors 110 and microelectronic element 102 and the carrier 910.

In a particular embodiment, when the normal operating temperature of a packaged microelectronic element (e.g., FIGS. 1B-C) is 100° C., the material of the inner regions may be selected to have a glass transition temperature Tg of 60 to 100° C., for example. In a particular embodiment, the second (outer) regions can also be made of material which has a glass transition temperature at or near the normal operating temperature of the packaged microelectronic element. For instance, in the above example in which the normal operating temperature is 100° C., the material of the second (outer) regions may be selected to have a glass transition temperature Tg from 80 to 120° C.

In one embodiment, the first regions or the second regions, or both can include materials having properties that remain relatively stable with temperature. Stated another way, the materials can be selected so that they do not have glass transition temperatures at or below a normal operating temperature of the packaged microelectronic element. In such embodiment, the stiffness of the material can remain relatively constant with temperature. A variety of compliant materials are available for this purpose, such as various rubber types including silicone rubber, polystyrene, as well as flexibilized epoxy, and unfilled epoxy or epoxy (e.g. cyanate ester epoxy) having a low fill content, among others. The rigidity of such materials can be measured as a durometer value. In a particular case, the durometer values of the first and second regions 200, 500 can correspond to greater flexibility in the first regions than in the second regions.

In a particular embodiment, the microelectronic element 102 can be one of a plurality of microelectronic elements (not shown) of a multi-chip module (MCM) in which the carrier 910 is also flip-chip connected with another microelectronic element through connectors (not shown) attached to contacts at surface 902. In such case, the flexibility of the inner regions can enable joining the microelectronic element 102 and at least one other microelectronic element with the carrier 910 using bonding metals which have different melting temperatures. For example, the connectors 110 used to connect a first microelectronic element 102 to carrier 910 and those used to connect another microelectronic element (not shown) to the carrier 910 can include different eutectic bonding metal alloys which have different melting temperatures. This allows the connectors 110 of the first microelectronic element 102 to be joined to or detached from the carrier at a different temperature than the connectors of the other microelectronic element. Thus, the microelectronic elements can be joined to or detached from the MCM at progressively higher temperatures reached during a sequential process, rather than requiring all microelectronic elements to be joined at the same time. In such embodiment, the relatively high compressibility of the inner regions can yield to differential thermal expansion stresses which occur over a range of joining temperatures used in such sequential joining process.

Figure 2A:
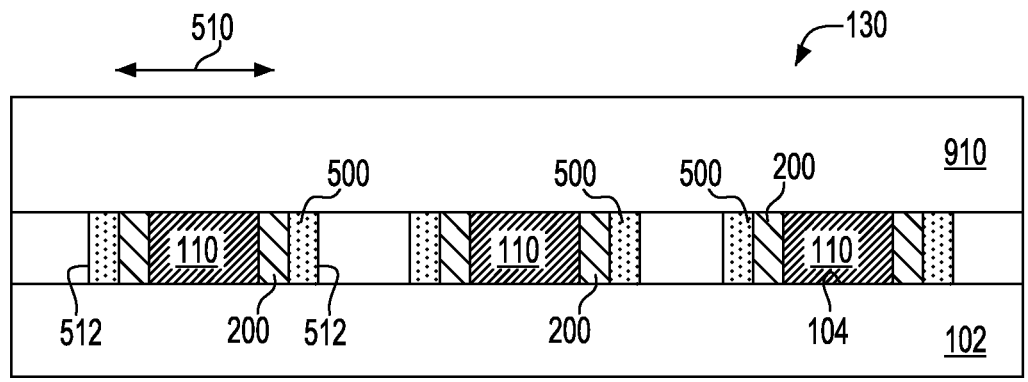
FIG. 2A is a sectional view illustrating a microelectronic package in accordance with another embodiment of the invention.
Figure 2B:
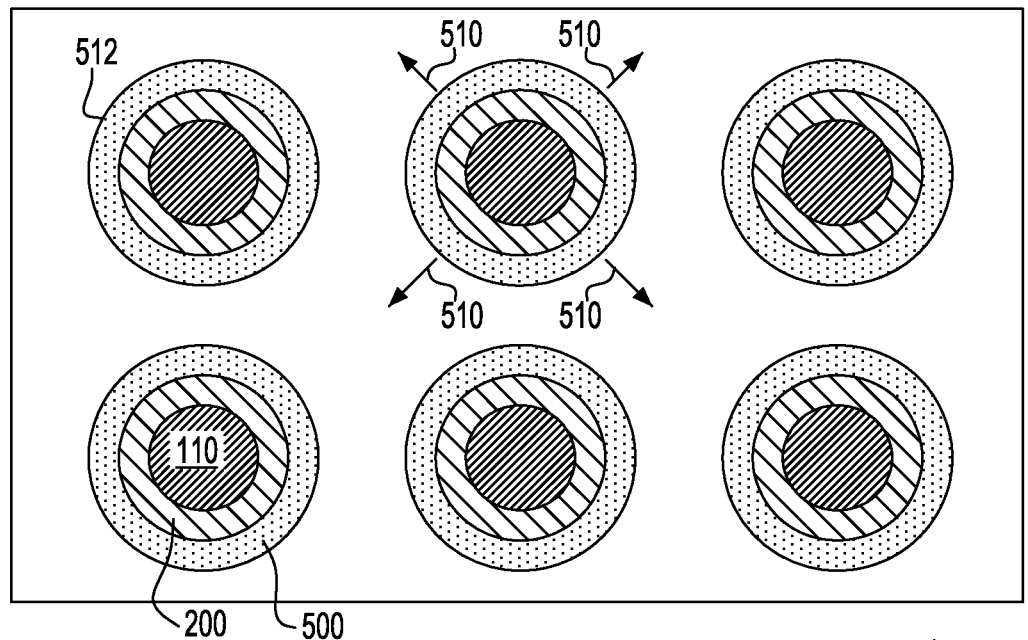
FIG. 2B is a plan view corresponding to the microelectronic assembly shown in FIG. 2A.

FIGS. 2A-B illustrate a microelectronic package 130 according to a variation of the above-discussed embodiment (FIGS. 1A-C), in which an underfill between the second regions 500 has been omitted. In such case, spaces can exist between adjacent exposed edges 512 of the second regions 500 in directions 510 radially outward from connectors 110 along the surface 104 of the microelectronic element 102. In such package, the second regions 500 can be relatively rigid so as to fulfill the role of the underfill in maintaining a relatively rigid connection between the microelectronic element 102 and the carrier 910. In that way, stresses due to differential thermal expansion between the microelectronic element 102 and the carrier 910 can be resisted by the relatively rigid second regions, thus maintaining the outward dimensional integrity of the package. On the other hand, the first regions, having compliancy rather than rigidity, can yield to stresses of the connectors 110 expanding in radially outward directions 510, thus accommodating those connector stresses, despite the second regions maintaining overall rigidity of the package. Thus, the underfill can be omitted because the second regions 500 can reinforce the rigidity of the package 130 while the first regions 200 can yield to stresses. The stress-accommodating properties of the first regions 200 might even reduce the amount of stress the second regions 500 are required to resist to maintain the rigidity of the package.

Figure 3A:
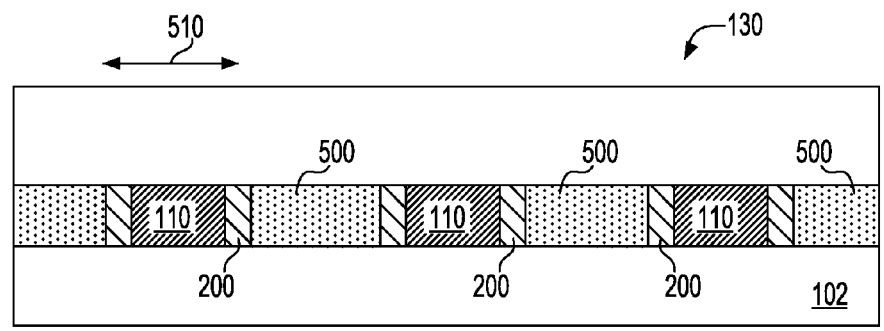
FIG. 3A is a sectional view illustrating a microelectronic package in accordance with another embodiment of the invention.
Figure 3B:
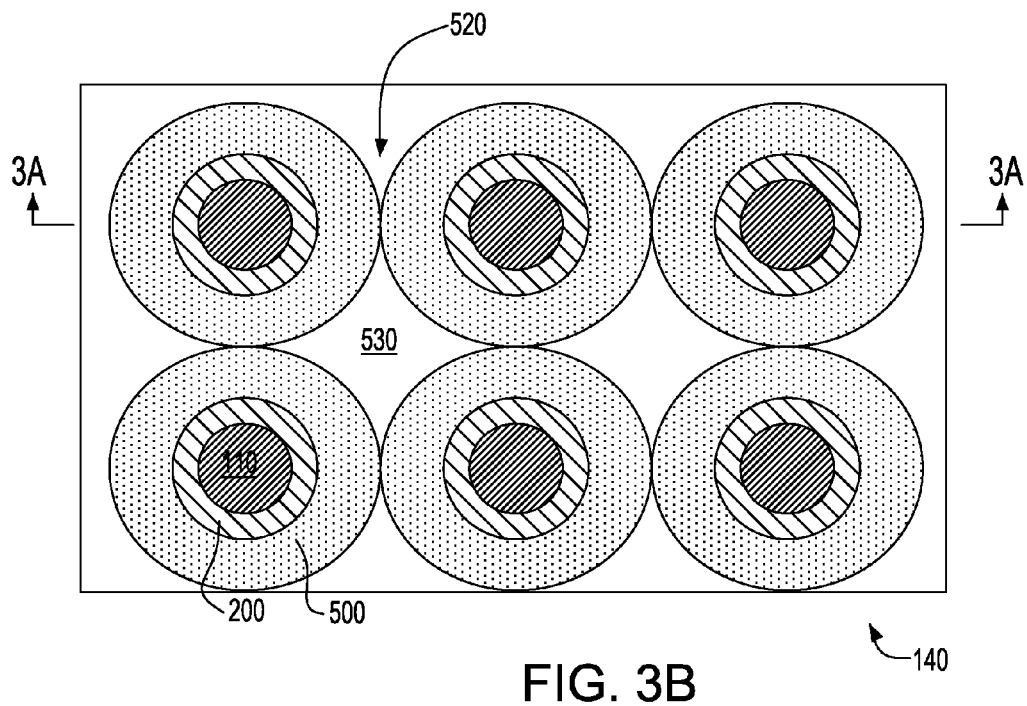
FIG. 3B is a plan view corresponding to the microelectronic assembly shown in FIG. 3A.

FIGS. 3A-B illustrate a microelectronic package 140 according to a variation of the embodiment (FIGS. 2A-B) discussed above in which the second regions 500 extend outward such that the second regions touch or merge together at locations 520 between the connectors, while leaving gaps 530 between adjacent ones of the second regions. The larger size of the second regions 500 and the connections between them at the merged locations 520 may help to increase their rigidity, especially in packages which do not include an underfill that occupies the remaining spaces between the second regions 500.

Figure 3C:
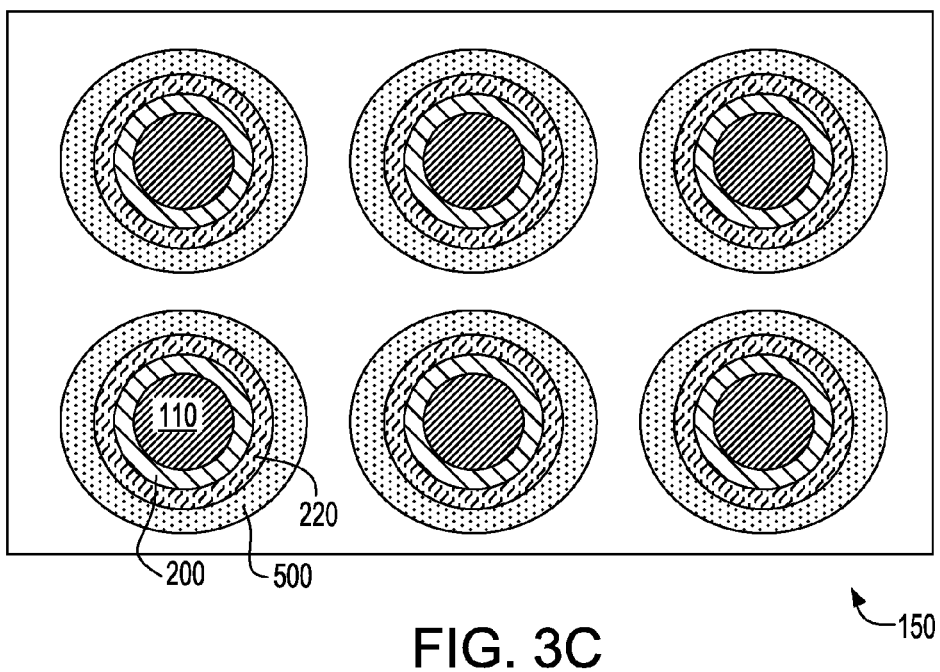
FIG. 3C is a plan view illustrating a microelectronic assembly according to yet another embodiment of the invention.

FIG. 3C illustrates a microelectronic package 150 according to yet another embodiment in which elements surrounding the connectors 110 have first regions 200, second regions 220 and third regions 500 which are co-axial to one another. An underfill (not shown) may or may not fill spaces between exposed edges of adjacent second regions of the structure. In such embodiment, the first regions and second regions can each be compressible, while the first regions may have greater compressibility than the second regions at an operating temperature of the chip. For example, the first regions may have a compliant property at the normal chip operating temperature and the second regions can have a property which is stiffer than the first regions and yet not as stiff or rigid as the third regions 500. In this case, the stiffer property of the second regions can act to partially restrain volume expansion in the first regions and the connectors so as to help contain a movement of the material of the connectors. The third regions 500 may function to maintain a rigidity of the package, similar to the function of an underfill.

Figure 4:
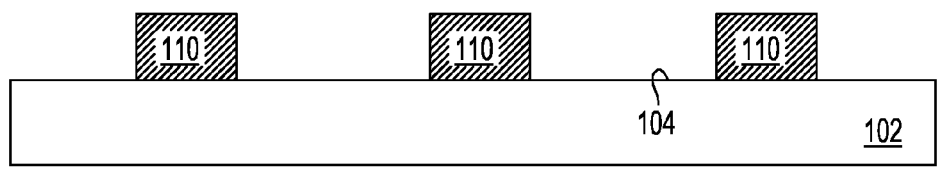
FIG. 4 is a sectional view illustrating a stage in processing to form a packaged microelectronic element in accordance with one embodiment of the present invention showing electrical connectors disposed on a substrate.

FIGS. 4 through 10 illustrate stages in a method of fabricating an assembly 100 (FIGS. 1A-B) and a packaged microelectronic element 900 (FIG. 1C) in accordance with an embodiment of the invention. FIG. 4 is a sectional view of an early stage in a method of manufacturing a microelectronic assembly 100 (FIGS. 1A-B). FIG. 4 illustrates a microelectronic element 102, which can be a semiconductor element, e.g., as discussed above, a wafer or semiconductor chip, etc., having semiconductor devices thereon and electrically interconnecting wiring between the devices. A plurality of electrically conductive connector elements 110 can be attached to contacts (not shown) at a face 104 of the microelectronic element. The connector elements 110 in a preferred embodiment are solder balls as shown, which are disposed at a distance from one another. The plurality of solder balls can be disposed in one embodiment at substantially the same distance or can be disposed at varying distances from one another.

Figure 5:
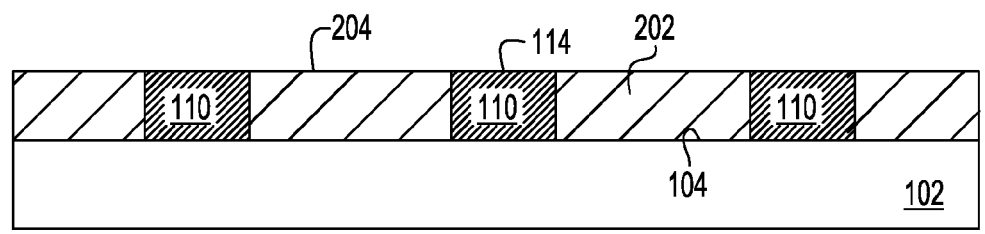
FIG. 5 is a sectional view illustrating a stage of processing subsequent to the stage illustrating in FIG. 4.

FIG. 5 illustrates a subsequent stage of processing in the manufacturing of microelectronic assembly 100 (FIG. 4). A first or inner compressible layer 202 can be provided, e.g., deposited, dispensed, screened, stenciled over the face 104 of the microelectronic element such as to surround the sides of the connectors (i.e. solder balls) 110 of FIG. 4. The top surface 204 of the first compressible layer 202, as shown, can be flush with the top layer 114 of the connectors 110 such as to cover sides of the connectors 110, and not cover the top layer of electrical connectors 110, to allow for the connectors to be connected later to the chip 910 as was previously discussed. The layer can be disposed to the level shown in one embodiment and in alternate embodiments is deposited to a different level and planarized to the level shown in FIG. 5.

The first compressible layer 202 can include any of a variety of materials such as described above with reference to FIGS. 1A-C. The first compressible layer 202 should include or consist essentially of a material which can accommodate expansion of connectors 110 at a temperature at, near, or beyond a normal operating temperature of the chip, or as temperature exceeding a melting temperature of the connectors.

In the subsequent stage of processing, the first compressible layer 202 will be patterned and certain portions of the layer will be removed. In one embodiment of the present invention, a photosensitive or electron beam sensitive compressible material can be used to require no further processing such as discussed in conjunction with FIG. 6. However, in an alternate embodiment as will be discussed in conjunction with the next two processing steps and coordinating figures, FIGS. 6 and 7, can also be alternatively implemented.

Figure 6:
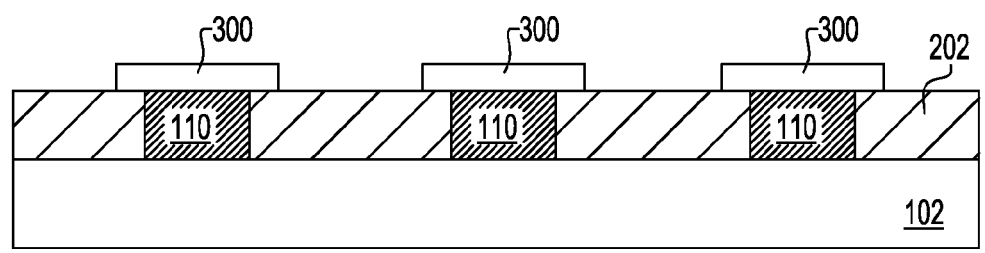
FIG. 6 is a sectional view illustrating a stage of processing subsequent to the stage illustrating in FIG. 5.

FIG. 6 is a sectional view of a subsequent stage of processing, where mask patterns 300 are formed to overlie the connectors 110. In one example, the mask patterns 300 can be formed using photolithographic techniques as known to those skilled in the art so that the first compressible layer 202 can be patterned in the subsequent stage of processing.

Figure 7:
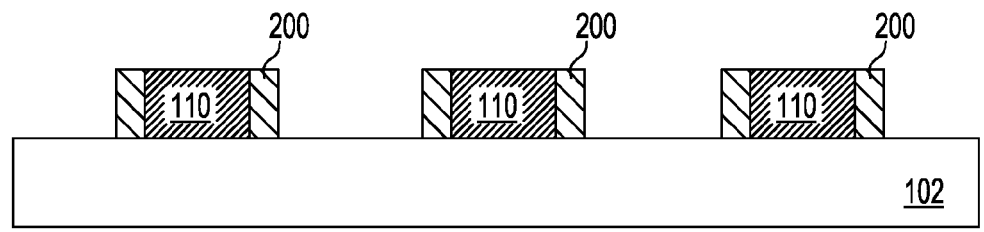
FIG. 7 is a sectional view illustrating a stage of processing subsequent to the stage illustrating in FIG. 6.

FIG. 7 is a sectional view of a subsequent stage of processing in which the first compressible layer 202 has been patterned by one of available removal processes, such as etching, laser processing, etc., wherein the mask patterns (FIG. 6) have protected the regions 200 from being removed. These regions contact the connectors 110 as first dielectric regions 200.

Figure 8:
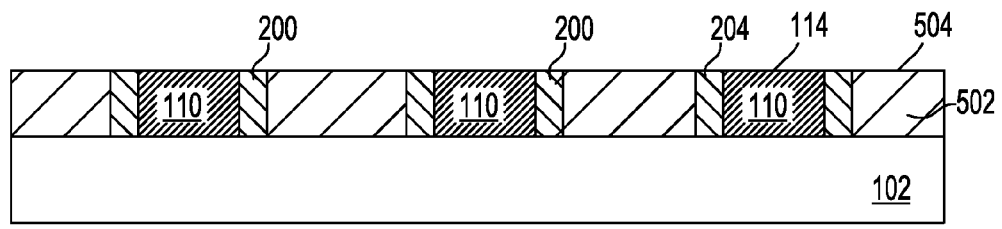
FIG. 8 is a sectional view illustrating a stage of processing subsequent to the stage illustrating in FIG. 7.

FIG. 8 is the sectional view in a subsequent stage of processing in which a second layer 502 of compressible material is formed, e.g., deposited over the substrate 102 so as to surround the sides of the first compressible layer 200 as shown in FIG. 7. The layer 502 can be formed to have an exposed surface 504 which is co-planar with exposed surfaces 114, 204 of the connectors 110 and the first regions 200, respectively.

The second compressible layer 502 can include an appropriate material or combination of materials. Layer 502 can have a stable melting point above the melting point of the connectors 110. However, as discussed earlier, this material is chosen in relation with the material of the first or inner layer, such that this second layer provides more rigidity than that of the first layer 200. By contrast, the inner or first compressible material 200 must be of a more compressible material than that of the second layer to accommodate the expansion of connectors 110 at high thermal temperatures or even when melted.

Figure 9:
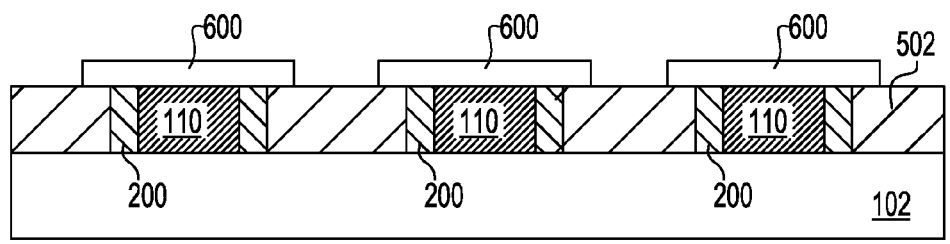
FIG. 9 is a sectional view illustrating a stage of processing subsequent to the stage illustrating in FIG. 8.
Figure 10:
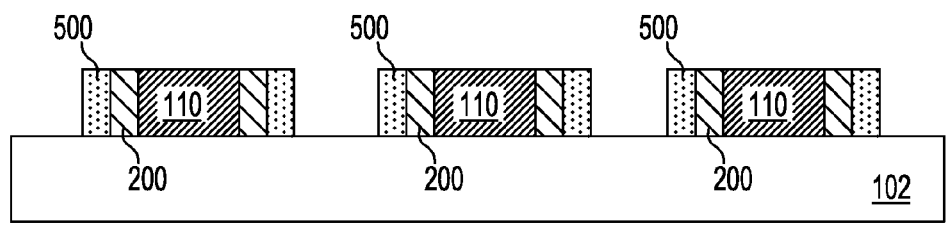
FIG. 10 is a sectional view a stage of processing subsequent to the stage illustrating in FIG. 9.

This second layer 502 can also be patterned in processes as discussed before. FIGS. 9 and 10, provide one embodiment of the present invention where a mask has been used. FIG. 9 is a sectional view of a subsequent stage of processing where mask patterns 600 have been formed over the connectors, first regions 200 and portions of the second layer 502 using photolithographic techniques.

FIG. 10 is a sectional view of a subsequent stage of processing where as discussed one of several conventional techniques are used to pattern the second compressible layer to form second regions which surrounds a corresponding first region 200 and connector which are co-axial therewith.

Referring again to FIG. 1B, a layer of underfill 800 can be deposited over the face 104 of the microelectronic element 102 to fill the spaces which remain between the structures shown in FIG. 10.

While the invention has been described in accordance with certain preferred embodiments thereof, many modifications and enhancements can be made thereto without departing from the true scope and spirit of the invention, which is limited only by the claims appended below.

What is claimed is:

1. A method of fabricating a microelectronic assembly, comprising:
    forming a plurality of electrically conductive connectors extending away from a face of a microelectronic element, each of the connectors having a surface facing away from the face of the microelectronic element;
    forming compressible dielectric first regions contacting the surfaces of the connectors and surrounding the connectors;
    forming compressible dielectric second regions surrounding the dielectric first regions; and
    forming third regions surround the dielectric second regions, wherein the first regions are more compressible than the second regions and the second regions are more compressible than the third regions.

2. A method as claimed in claim 1, wherein the microelectronic element is a semiconductor chip, the method further comprising attaching a carrier such that a contact bearing face of the carrier faces toward the plurality of connectors and the contacts of the carrier electrically connects with the connectors.

3. A method as claimed in claim 2, further comprising forming an underfill between adjacent ones of the second regions, the underfill being less compressible than a material of the first regions.

4. A method as claimed in claim 3, wherein the underfill is less compressible than the second regions.

5. A method as claimed in claim 2, wherein the plurality of first regions are formed to include a thermoplastic material having a glass transition temperature at or below an operating temperature of the microelectronic element.

6. A method as claimed in claim 5, wherein the plurality of second regions are formed to include a thermoplastic material having a glass transition temperature at or below an operating temperature of the microelectronic element.

7. A method as claimed in claim 2, wherein a compressibility of at least one of the plurality of first regions or the plurality of second regions is graded with distance from the connectors.

8. A method as claimed in claim 1, further includes forming the first regions such that a compressibility of at least the plurality of first regions is graded with a distance from the respective connectors.

9. A method as claimed in claim 1, further includes attaching connectors including solder to contacts at the face.

10. A method as claimed in claim 1, further includes attaching connectors which include solder.

11. A method as claimed in claim 1, further includes attaching connectors which include lead free solder.

* * * * *